(12) United States Patent
Colvin et al.

(10) Patent No.: US 10,138,551 B2
(45) Date of Patent: Nov. 27, 2018

(54) SUBSTRATE PROCESSING APPARATUSES AND SYSTEMS

(75) Inventors: Ronald L. Colvin, Gilbert, AZ (US); Dennis Goodwin, Sr., Happy Jack, AZ (US); Jeff Mittendorf, Chandler, AZ (US); Charles J. Moretti, Scottsdale, AZ (US); John W. Rose, Cave Creek, AZ (US); Earl Blake Samuels, Scottsdale, AZ (US)

(73) Assignee: GES Associates LLC, Phoenix, AZ (US)

( * ) Notice: Subject to any disclaimer, the term of this patent is extended or adjusted under 35 U.S.C. 154(b) by 815 days.

(21) Appl. No.: 13/193,498

(22) Filed: Jul. 28, 2011
(Under 37 CFR 1.47)

(65) Prior Publication Data

US 2012/0148744 A1    Jun. 14, 2012

Related U.S. Application Data

(60) Provisional application No. 61/369,047, filed on Jul. 29, 2010, provisional application No. 61/369,077, filed on Jul. 30, 2010, provisional application No. 61/369,072, filed on Jul. 30, 2010.

(51) Int. Cl.
| | |
|---|---|
| *C23C 16/00* | (2006.01) |
| *H05B 3/10* | (2006.01) |
| *H05B 3/68* | (2006.01) |
| *C23C 16/455* | (2006.01) |
| *C23C 16/46* | (2006.01) |

(52) U.S. Cl.
CPC .. *C23C 16/45502* (2013.01); *C23C 16/45563* (2013.01); *C23C 16/46* (2013.01)

(58) Field of Classification Search
CPC ... H05B 3/10; H05B 3/12; H05B 3/14; H05B 3/141; H05B 3/143; H05B 3/20; H05B 3/22; H05B 3/68; C23C 16/45502; C23C 16/45563; C23C 16/46; C23C 16/00
USPC ........... 219/553, 443.1, 444.1, 391; 118/725, 118/715, 720, 728, 50
See application file for complete search history.

(56) References Cited

U.S. PATENT DOCUMENTS

| | | |
|---|---|---|
| 2,052,869 A | 9/1936 | Coanda |
| 3,406,044 A | 10/1968 | Harris |
| 3,717,926 A | 2/1973 | Anikin et al. |
| 3,925,577 A | 12/1975 | Fatzer et al. |
| 4,081,313 A | 3/1978 | McNeilly et al. |
| 4,382,113 A | 5/1983 | Schwartz et al. |

(Continued)

FOREIGN PATENT DOCUMENTS

| | | |
|---|---|---|
| DE | 19932033 A1 | 1/2000 |
| EP | 1121836 B1 | 2/2007 |

(Continued)

OTHER PUBLICATIONS

Supplementary European Search Report for European Patent Application No. 11813211.7.

(Continued)

*Primary Examiner* — Michael G Hoang
(74) *Attorney, Agent, or Firm* — Letham Law Firm LLC; Lawrence Letham

(57) ABSTRACT

A system for processing substrates is described. In one embodiment, the system comprises a process chamber, at least one electrical resistance heater, and at least one Coanda effect gas injector.

22 Claims, 14 Drawing Sheets

(56) References Cited

U.S. PATENT DOCUMENTS

| | | | |
|---|---|---|---|
| 4,410,796 A | 10/1983 | Wilsey | |
| 4,533,822 A | 8/1985 | Fuji et al. | |
| 4,539,930 A | 9/1985 | Stuck et al. | |
| 4,774,523 A * | 9/1988 | Beaufort | F26B 3/30 |
| | | | 219/200 |
| 5,059,770 A | 10/1991 | Mahawili | |
| 5,221,556 A | 6/1993 | Hawkins et al. | |
| 5,269,847 A | 12/1993 | Anderson et al. | |
| 5,294,778 A | 3/1994 | Carman et al. | |
| 5,433,169 A | 7/1995 | Nakamura | |
| 5,700,992 A * | 12/1997 | Honda | C23C 16/46 |
| | | | 219/444.1 |
| 5,766,363 A * | 6/1998 | Mizuno et al. | 118/725 |
| 5,810,942 A | 9/1998 | Narayanswami et al. | |
| 5,814,561 A | 9/1998 | Jackson | |
| 5,970,214 A | 10/1999 | Gat | |
| 6,039,269 A | 3/2000 | Mandzukic | |
| 6,093,913 A | 7/2000 | Schrenker et al. | |
| 6,177,646 B1 | 1/2001 | Okumura et al. | |
| D452,561 S | 12/2001 | Andersson et al. | |
| 6,331,212 B1 | 12/2001 | Mezey, Sr. | |
| 6,503,322 B1 * | 1/2003 | Schrenker et al. | 117/204 |
| 6,617,553 B2 | 9/2003 | Ho et al. | |
| 6,646,235 B2 | 11/2003 | Chen et al. | |
| 6,730,177 B1 | 5/2004 | Talley et al. | |
| 6,740,853 B1 | 5/2004 | Johnson et al. | |
| 6,774,606 B1 | 8/2004 | Mezey, Sr. | |
| 6,875,960 B2 | 4/2005 | Yamaguchi et al. | |
| 6,936,137 B2 | 8/2005 | Moeller et al. | |
| 7,126,092 B2 | 10/2006 | Lin et al. | |
| 7,597,756 B2 | 10/2009 | Mueller et al. | |
| 7,709,398 B2 | 5/2010 | Strauch et al. | |
| 2002/0100557 A1 | 8/2002 | Maocheng et al. | |
| 2002/0125239 A1 | 9/2002 | Chen et al. | |
| 2004/0112888 A1 * | 6/2004 | Tachikawa et al. | 219/468.1 |
| 2005/0016986 A1 * | 1/2005 | Ito | 219/444.1 |
| 2007/0163811 A1 * | 7/2007 | Gutmark et al. | 175/340 |
| 2008/0092812 A1 * | 4/2008 | McDiarmid et al. | 118/695 |
| 2008/0092818 A1 | 4/2008 | Fink et al. | |
| 2008/0150480 A1 * | 6/2008 | Navid | 320/113 |
| 2009/0081827 A1 | 3/2009 | Yang et al. | |
| 2009/0163042 A1 | 6/2009 | Tseng et al. | |
| 2009/0314762 A1 | 12/2009 | Cui et al. | |
| 2010/0087050 A1 | 4/2010 | Armour et al. | |
| 2010/0101497 A1 * | 4/2010 | Izuta et al. | 118/730 |
| 2010/0151680 A1 | 6/2010 | Wang et al. | |
| 2011/0073039 A1 | 3/2011 | Colvin | |
| 2011/0198417 A1 | 8/2011 | Detmar et al. | |

FOREIGN PATENT DOCUMENTS

| | | |
|---|---|---|
| JP | 63126547 | 5/1988 |
| JP | 2022459 | 1/1990 |
| JP | 04-287312 | 10/1992 |
| JP | 6105634 B | 12/1994 |
| JP | 2001-148350 A | 5/2001 |
| JP | 2002-141159 | 5/2001 |
| JP | 2002373846 A | 12/2002 |
| JP | 2005-501397 | 10/2005 |
| JP | 2006-060212 | 3/2006 |
| JP | 2007-157661 | 6/2007 |
| KR | 100197201 B1 | 6/1999 |
| KR | 10-2000-0010643 | 2/2000 |
| KR | 10-2001-0043049 | 5/2001 |
| WO | WO 02/41370 A2 | 5/2002 |
| WO | 02/084710 A2 | 10/2002 |
| WO | WO 02/084710 A2 | 10/2002 |

OTHER PUBLICATIONS

U.S. Appl. No. 61/277,624, dated Sep. 28, 2009, Colvin.
U.S. Appl. No. 61/304,073, dated Feb. 12, 2010, Detmar et al.
I. Reba, "Applications of the Coanada Effect," Scientific American, vol. 214, No. 6, Jun. 1966, pp. 84-92.
Wafer Heater for MBE & PVD, Korea Vacuum Tech., Ltd., #962-1, Goyang-Ri, Wolgot-Myun, Kimpo-City, 415-871 Korea, Tel +82-31-987-6320, Fax +82-987-9149, http://www.koreavac.com.
Office Action dated Jan. 2, 2013 for U.S. Appl. No. 12/890,463, filed Sep. 24, 2010.
PCT International Search Report and Written Opinion of the International Searching Authority dated Mar. 14, 2012 for PCT/US2011/046058.
Office Action dated May 4, 2012 for U.S. Appl. No. 13/194,947, filed Jul. 30, 2011.
PCT International Search Report and Written Opinion of the International Searching Authority dated Apr. 6, 2012 for PCT/US2011/045796.
PCT International Search Report and Written Opinion of the International Searching Authority dated Mar. 28, 2012 for PCT/US2011/046059.

* cited by examiner

SUBSTRATE PROCESSING APPARATUSES AND SYSTEMS

CROSS-REFERENCE TO RELATED APPLICATIONS

The present application claims benefit of U.S. patent application Ser. No. 61/369,047, titled "SUBSTRATE PROCESSING APPARATUSES AND SYSTEMS," to Ronald L. Colvin et al., filed Jul. 29, 2010. The present application is related to: U.S. Patent Application Ser. No. 61/369,077, titled "ELECTRICAL RESISTANCE HEATER AND HEATER ASSEMBLIES," to Ronald L. Colvin et al., filed Jul. 30, 2010; U.S. Patent Application Ser. No. 61/369,072, titled "SYSTEMS, APPARATUSES, AND METHODS FOR CHEMICALLY PROCESSING SUBSTRATES USING THE COANDA EFFECT," to Ronald L. Colvin et al., filed Jul. 30, 2010; U.S. Pat. No. 6,331,212, filed 17 Apr. 2000; and U.S. Pat. No. 6,774,060, filed 7 Jul. 2001. The contents of all of these applications and patents are incorporated herein in their entirety by this reference.

BACKGROUND

This invention relates to systems, apparatuses, and methods for processing substrates; more particularly, chemically and/or thermally processing substrates for electronic devices and optical-electronic devices.

Chemical and/or thermal processing of substrates is used in numerous applications such as modern microelectronic device manufacturing. These processes may include processes such as chemical vapor deposition (CVD) and epitaxial semiconductor deposition such as silicon epitaxy, silicon germanium epitaxy, and compound semiconductor epitaxy. These processes may be performed using one or more gases for causing reactions on the surface of substrates such as semiconductor wafers, flat panel display substrates, solar cell substrates, and other substrates.

SUMMARY

This invention seeks to provide systems, apparatuses, and methods that can overcome one or more deficiencies in processing substrates. One aspect of the invention is a system for processing substrates. The system comprises a process chamber; a substrate support disposed in the process chamber, a heating system, and a gas injection system.

In one embodiment, the heating system comprises at least one electrical resistance heater comprising a sinusoidal heating element having a plurality of peaks disposed to delineate an outer radius and a plurality of troughs disposed to delineate an inner radius. The cross-section width of the heating element is a first function of radial position and the cross-section thickness of the heating element is a second function of radial position so that the heating element provides a substantially constant heat flux at each radial position and forms a substantially constant spacing between facing side surfaces of the heating element.

In another embodiment, the gas injection system comprises at least one Coanda effect gas injector disposed proximate a peripheral edge of the substrate support so as to provide a Coanda effect gas flow over the surface of the substrate(s) and/or substrate support.

In yet another embodiment the heating system comprises at least one electrical resistance heater comprising a sinusoidal heating element having a plurality of peaks disposed to delineate an outer radius and a plurality of troughs disposed to delineate an inner radius. The cross-section width of the heating element is a first function of radial position and the cross-section thickness of the heating element is a second function of radial position so that the heating element provides a substantially constant heat flux at each radial position and forms a substantially constant spacing between facing side surfaces of the heating element. The gas injection system comprises at least one Coanda effect gas injector disposed proximate a peripheral edge of the substrate support so as to provide a Coanda effect gas flow over the surface of the substrate(s) and/or substrate support.

Another aspect of the present invention is a method of processing a substrate. The method comprises providing a substrate and providing one or more reactive gases. The method also comprises providing at least one heater or heater assembly comprising a sinusoidal heating element having a plurality of peaks disposed to delineate an outer radius and a plurality of troughs disposed to delineate an inner radius. The cross-section width of the heating element is a first function of radial position and the cross-section thickness of the heating element is a second function of radial position so that the heating element provides a substantially constant heat flux at each radial position and forms a substantially constant spacing between facing side surfaces of the heating element. The method further comprises applying heat to the substrate with the at least one heater or heating assembly and creating a Coanda effect gas flow of the one or more reactive gases over the substrate.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

BRIEF DESCRIPTION OF THE DRAWINGS

FIG. 3-1 is a perspective back view of an apparatus for an embodiment of the present invention.

FIG. 3-2 is a perspective view of an electrical adapter according to an embodiment of the present invention.

FIG. 3-3 is a perspective cross-section view of an electrical adapter according to an embodiment of the present invention.

FIG. 4-1 is a perspective back view of an apparatus for an embodiment of the present invention.

FIG. 5-1 is a back view of an apparatus for an embodiment of the present invention.

FIG. 7-1 is a cross-section side view of the apparatus shown in FIG. 7.

FIG. 8-1 is a top view of the interior of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc. A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

The operation of embodiments of the present invention will be discussed below in the context of the deposition of an epitaxial layer of doped silicon on a silicon wafer. It is to be understood, however, that embodiments in accordance with the present invention may be used to perform essentially any substrate processing that may benefit from layer thickness uniformity, composition uniformity, and/or temperature uniformity across the substrate. As examples, embodiments of the present invention may include equipment and/or processes for depositing layers of materials such as gallium nitride, gallium arsenide, silicon germanium, gallium aluminum arsenide, indium phosphide, cadmium telluride, mercury cadmium telluride, silicon carbide, silicon nitride, silicon dioxide, doped silicon oxide, boron phosphorus silicate glass, phosphorus silicate glass, and others.

Figure 1:
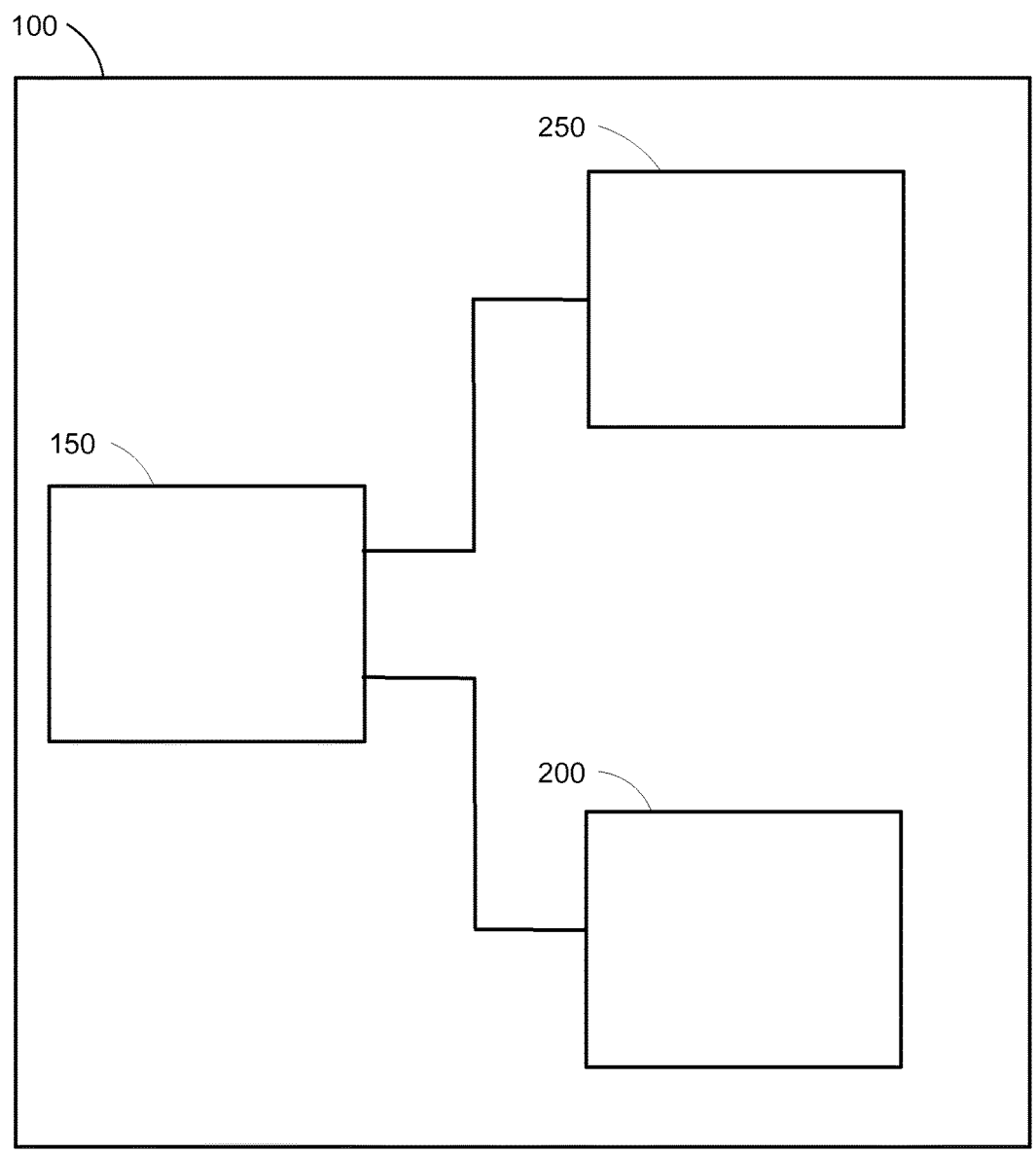
FIG. 1 is a block diagram of an embodiment of the present invention.

Reference is now made to FIG. 1 where there is shown a block diagram of a system 100 according to an embodiment of the present invention. System 100 includes a process chamber 150. Process chamber 150 may be a process chamber such as a process chamber for processing substrates such as substrates used for fabricating electronic and optoelectronic devices. The substrates may be substrates such as semiconductor wafers, single crystal substrates such as a Sapphire wafers, and glass substrate. System 100 also includes a heating system 200 for providing heat to the substrates. System 100 includes a gas injection system 250 for providing one or more gases or gas mixtures to the substrates and/or process chamber 150. System 100 may include, as an option, a control system. If present, the control system may be in communication with process chamber 150, heating system 200, and gas injection system 250 so as to monitor their operation, collect information, issue and execute commands to control the operation of system 100.

Figure 2:
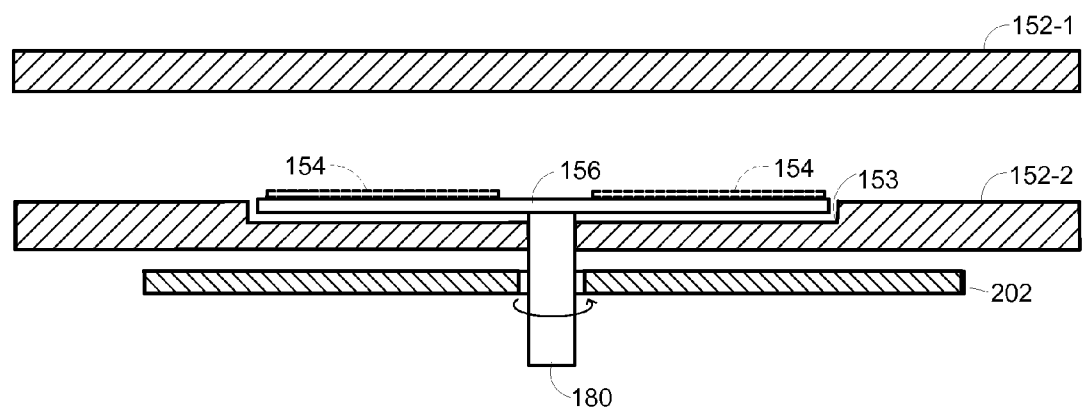
FIG. 2 is a cross-section side view of an embodiment of the present invention.

Reference is now made to FIG. 2 where there is shown a cross-section side view of a system 101 according to an embodiment of the present invention. System 101 comprises a process chamber having a top surface 152-1 and a bottom surface 152-2 substantially as shown in FIG. 2. Optionally, one or more substrates 154 (position of substrates shown as broken lines) may be placed on the bottom of the process chamber for processing. Alternatively, system 101 includes a substrate holder 156 disposed so as to hold one or more substrates 154 in the process chamber. As an option for some embodiments of the present invention, bottom surface 152-2 of the process chamber has a recessed area 153 that at least partially contains substrate holder 156.

System 101 shown in FIG. 2 comprises a rotary coupling 180 connected with substrate holder 156 so as to provide rotation for one or more substrates 154. More specifically, system 101 comprises rotary coupling 180 disposed for rotating the surface of substrate support 156 and the one or more substrates 154, if present thereon. Alternatively, system 101 may comprise a linear actuator connected with substrate support 156 for linear translation of the surface of substrate support 156.

System 101 comprises a heating system that includes a heater assembly 202 disposed so as to provide heat to the substrates 154. System 101 has heater assembly 202 disposed so as to face the external side of bottom surface 152-2 so as to heat the substrates from the back surface. Heater assembly 202 includes one or more electrical resistance heaters.

Figure 3:
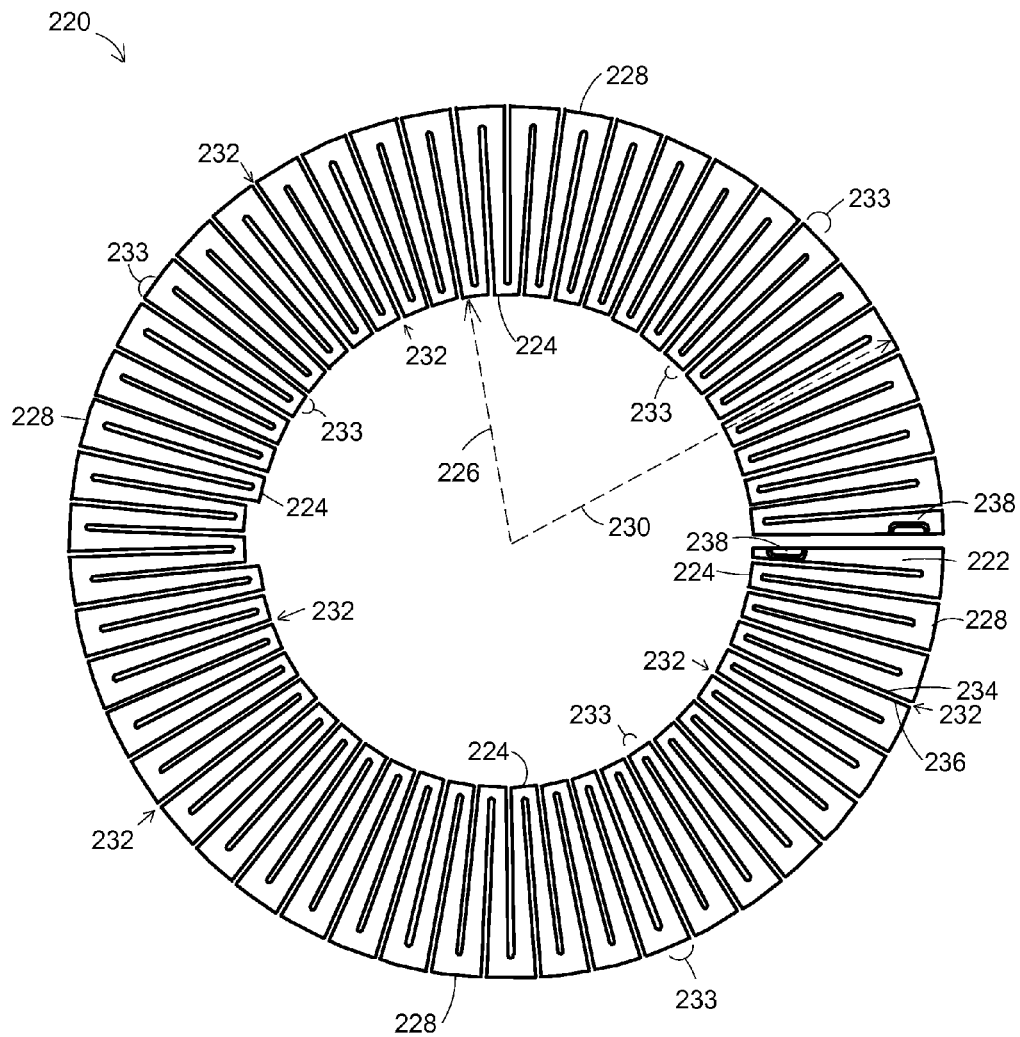
FIG. 3 is a back view of an apparatus for an embodiment of the present invention.
Figures 1, 3:
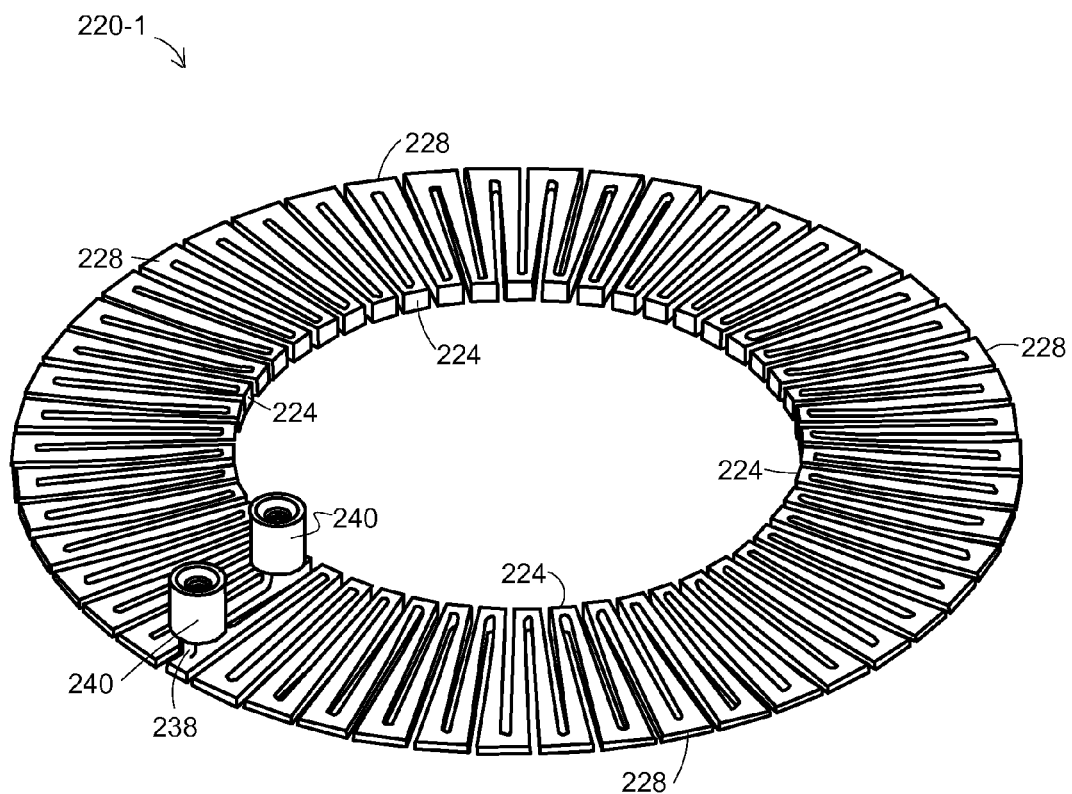
Figures 2, 3:
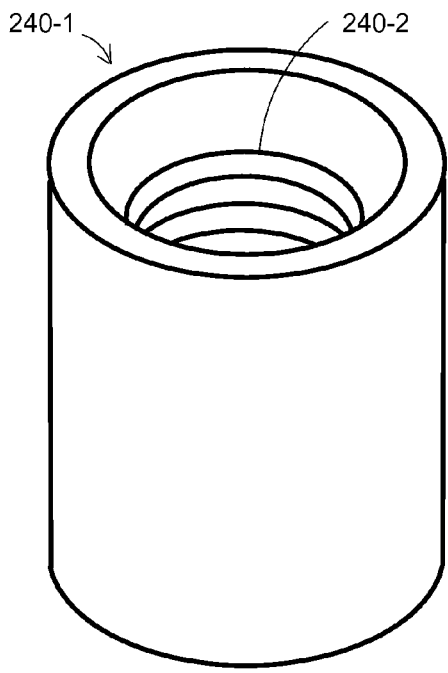
Figure 3:
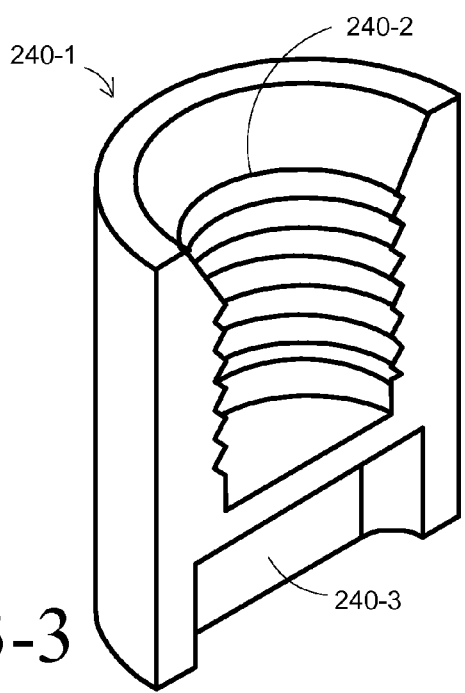

Reference is now made to FIG. 3 where there is shown a back view of an electrical resistance heater 220 that may be used in heater assembly 202 according to an embodiment of the present invention. Electrical resistance heater 220 is formed by a sinusoidal heating element 222 having a plurality of troughs 224 disposed to delineate an inner radius 226 and a plurality of peaks 228 disposed to delineate an outer radius 230. In other words, electrical resistance heater 220 forms a ring or section of a ring having an inner radius 226 and an outer radius 230 so as to make heater 220 circular, either a circle or part of a circle. The cross-section width of sinusoidal heating element 222 is a first function of radial position and the cross-section thickness of sinusoidal heating element 222 is a second function of radial position so that sinusoidal heating element 222 provides a substantially constant heat flux at each radial position and forms a substantially constant spacing 232 between facing side surfaces 234 and 236 of sinusoidal heating element 222. Spacing 232 between facing side surfaces of sinusoidal heating element 222 is maintained at a selected constant and may be kept to a minimum with the limits being determined by the need to avoid arcing, thermal expansion and contraction limitations, and fabrication limitations. Heating element 222 can be represented as having a plurality of spokes 233 extending from the inside radius 226 to the outside radius 230.

The cross-section area of sinusoidal heating element 222 is given by multiplying the cross-section width of sinusoidal heating element 222 generally at each radial position by the cross-section thickness of sinusoidal heating element 222 generally at each radial position. The cross-section area varies with radial position based on the size of the surface to be heated and the wattage requirement. Additional factors that determine the cross-section area of the sinusoidal heating element are the number of oscillations in the sinusoidal heating element, resistivity of the sinusoidal heating element, spacing between facing sides of the sinusoidal heating element, and the length of the sinusoidal heating element.

As indicated above, the cross-section thickness and the cross-section width of the heating element at each radial position are functions of the radial position on the sinusoidal heating element. The thickness can be represented in general by a function of the form $f_1(1/r)$ where r is radial position on the sinusoidal heating element and $f_1$ is the function. The term 1/r is used to indicate that the relation is an inverse relation. The width can be represented in general by a function of the form $f_2(r)$ where r is radial position on the sinusoidal heating element and $f_2$ is the function. Consequently, the cross-section area of the sinusoidal heating element is a function of the form $(f_1(1/r)(f_2(r))$.

For some embodiments of the present invention, the cross-section thickness of the sinusoidal heating element is derived from the equation:

$$t = 2\pi r_i^2 G t_i / (2\pi r^2 G - S r) \quad (1)$$

where t is cross-section thickness of the heating element, r is radial position on the heating element, π is the mathematical constant pi, $r_i$ is an inside radius of the heating element, $t_i$ is an initial trial thickness, G is a geometry factor equaling the angular width of the heating element spoke divided by the angular size of the heater, and S is the spacing between facing side surfaces of the heating element. More specifically, t and r are variables and π, $r_i$, $t_i$, G, and S are numerical parameters. With the knowledge of the numerical parameters for a heater, the thickness can be calculated as a function of radial position.

As will be recognized by persons of ordinary skill in the art, Equation 1 and the numerical parameters are the result of only one approach to obtaining a numerical representation of the dimensions of heaters according to one or more embodiments of the present invention. Other approaches will be recognized by persons of ordinary skill in the art in view of the disclosure in this specification. The derivation of Equation (1) was accomplished using π the mathematical constant, $r_i$ as a designer choice, an outside radius of the heater as a designer choice, G as a designer choice, and S as a designer choice. The initial trial thickness of the heater element at the inside radius, $t_i$, is also a designer choice, but optionally $t_i$ may have to be refined by iteration so that the resistance of the heater element is more suitably matched for use with the full voltage and current capacity of the power source to be used with the heater. The capacity of the power source is also a designer choice. One possible iteration procedure is presented below in an example heater design.

It is also possible to derive the numerical parameters or equivalent constants for an equation similar to Equation (1) if heater thickness data as a function of radial position is known for a heater. A further simplified equation for such situations could be of the form:

$$t = A/(B r^2 - S r) \quad (1.1)$$

where t, r, and S are the same as presented above and A and B are numerical values resulting from combining one or more of the numerical parameters presented above.

For some embodiments of the present invention, the cross-section width of the sinusoidal heating element is derived from the equation:

$$w = 2\pi G r - S \quad (2)$$

where w is the cross-section width of the heating element, r is the radial position on the heating element, π is the mathematical constant pi, G is a geometry factor equaling the angular width of the heating element spoke divided by the angular size of the heater, and S is a spacing between facing side surfaces of the heating element. The width of the heating element as a function of radial position can be calculated for more one or more embodiment of the present invention with designer specified values for angular width of the heating element spoke, the angular size of the heater, and the spacing.

A variety of materials may be used for sinusoidal heating element 222. According to one embodiment of the present invention, sinusoidal heating element 222 comprises a refractory electrical conductor. Sinusoidal heating element 222 may comprise graphite such as pyrolytic graphite. Further modifications can be made such as coating pyrolytic graphite with a material such as silicon carbide to produce sinusoidal heating element 222 having, as an example, a pyrolytic graphite conductor coated with silicon carbide. Examples of other materials that can be used for sinusoidal heating element 222 include, but are not limited to, nickel-chromium alloy, molybdenum, tantalum, tungsten, and other materials used for electrical resistance heating.

According to one embodiment of the present invention, spacing 232 between facing side surfaces of sinusoidal heating element 222 is at vacuum or filled with gas during operation of sinusoidal heating element 222.

FIG. 3 shows electrical resistance heater 220 comprising two optional electrical contacts 238 positioned approximately at each end of sinusoidal heating element 222. It is to be understood that other means of making contact can be used for electrical heater 220. Electrical contact 238 shown for the embodiment in FIG. 3 may be a tab machined as part of sinusoidal heating element 222. As an option, electrical contact 238 is oriented substantially perpendicular to the surface of electrical resistance heater 220. Other orientations for electrical contact 238 can be used as will be clear to persons of ordinary skill in the art in view of the present disclosure. Electrical contacts 238 can be used to apply a DC or AC current through sinusoidal heating element 222.

Reference is now made to FIG. 3-1 where there is shown a perspective view of an electrical resistance heater 220-1 that may be used in heater assembly 202 according to an embodiment of the present invention. Electrical resistance heater 220-1 is essentially the same as described for electrical resistance heater 220 described for FIG. 3 with the exception that electrical resistance heater 220-1 includes an optional electrical adapter 240 coupled with electrical contact 238 for each end of serpentine electrical conductor 222.

According to one embodiment of the present invention, electrical adapter 240 is formed so as to make a press-fit, also known in the art has an interference fit, coupling to electrical contact 238. For some embodiments of the present invention, serpentine heating element 222 may be made of pyrolytic graphite; as an option for those embodiments, electrical adapter 240 may be made of pyrolytic graphite. Optionally, electrical adapter 240 may be made of materials other than pyrolytic graphite that are also suitable for electrical connections.

The present inventors have found that a synergistic benefit may be occurring for embodiments of the present invention that use pyrolytic graphite for sinusoidal heating element 222 and pyrolytic graphite for electrical adapter 240 in a press-fit coupling configuration and a silicon carbide coating process. More specifically, applying a thermal coating of silicon carbide to sinusoidal heating element 222 and press-fit coupled electrical adapter 240 produces a mechanically strong connection between sinusoidal heating element 222 and electrical adapter 240 with a low contact resistance. Consequently, a strong mechanical connection is formed that is electrically conductive and it may be accomplished without complicated machining steps beyond a press-fit coupling.

The deposition conditions used for forming the silicon carbide coatings are the same as those typically used for coating pyrolytic graphite. Generally, a silicon source and a carbon source are caused to react at elevated temperatures 1200 degrees C. to produce a deposited coating of silicon carbide.

Reference is now made to FIG. 3-2 where there is shown a perspective view and FIG. 3-3 where there is shown a cross-section perspective view of an electrical adapter 240-1 suitable for one or more embodiments of the present invention. Electrical adapter 240-1 is a substantially rigid body made of a suitable electrical conductor such as pyrolytic graphite or other material suitable for electrical contact for an electrical resistance heater. Electrical adapter 240-1 has a threaded bore 240-2 that has been threaded for making a threaded connection. Electrical adapter 240-1 has a press-fit bore 240-3 that has been configured to make a press-fit coupling with electrical contacts of electrical resistance heaters such as, but not limited to, electrical resistance heater 220.

Figure 4:
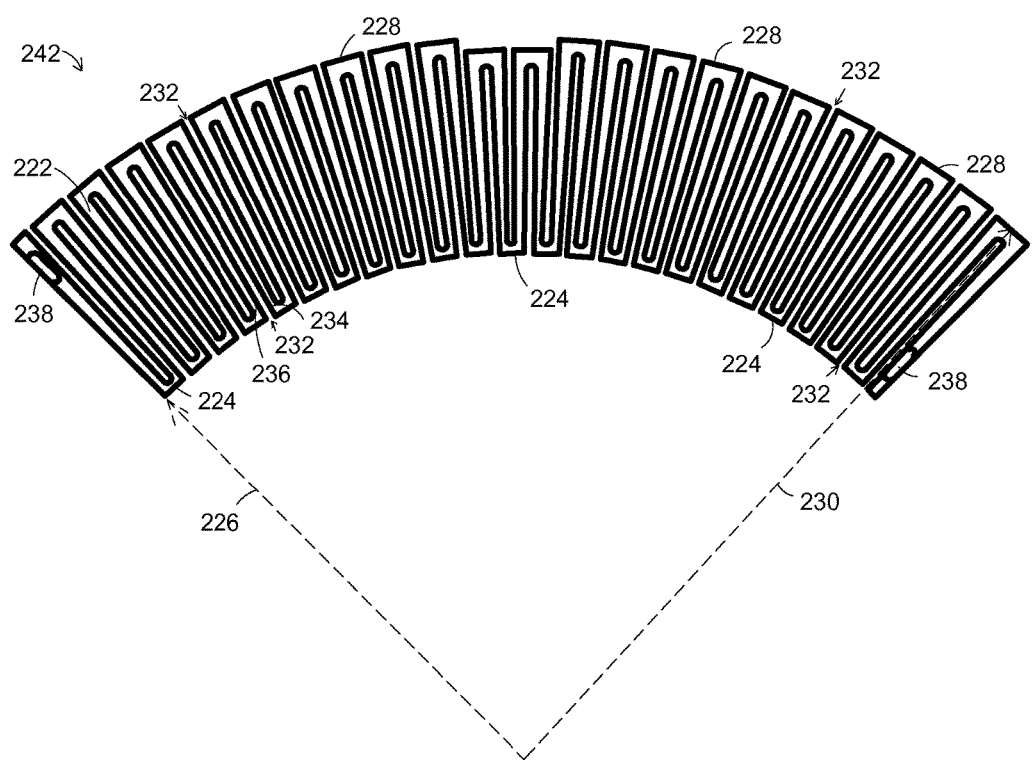
FIG. 4 is a back view of an apparatus for an embodiment of the present invention.
Figures 1, 4:
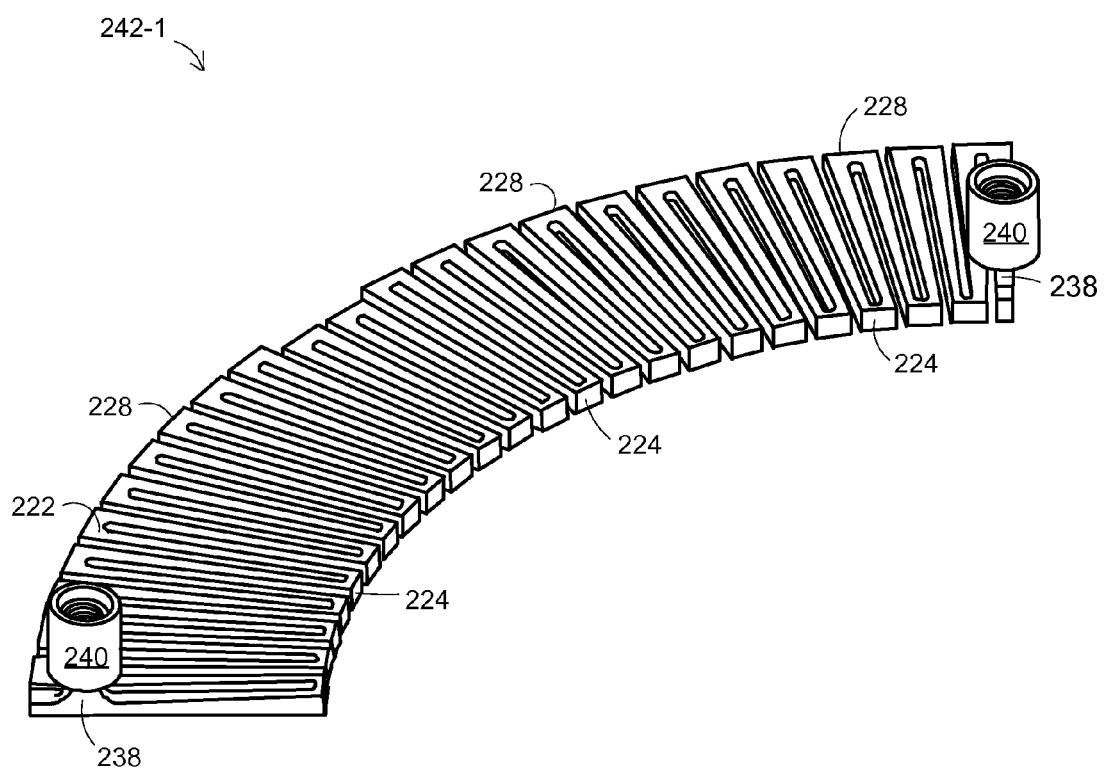

Reference is now made to FIG. 4 where there is shown a back view of an electrical resistance heater 242 that may be used in heater assembly 202 according to an embodiment of the present invention. Electrical resistance heater 242 is formed by a sinusoidal heating element 222 having a plurality of troughs 224 disposed to delineate an inner radius 226 and a plurality of peaks 228 disposed to delineate an outer radius 230. In other words, heater 242 forms a section of a ring having an inner radius 226 and an outer radius 230 so as to make heater 242 a part of a circle. The cross-section width of sinusoidal heating element 222 is a first function of radial position and the cross-section thickness of sinusoidal heating element 222 is a second function of radial position so that sinusoidal heating element 222 provides a substantially constant heat flux at each radial position and forms a substantially constant spacing 232 between facing side surfaces 234 and 236 of sinusoidal heating element 222. Spacing 232 between facing side surfaces of sinusoidal heating element 222 is maintained at a selected constant and may be kept to a minimum with the limits being determined by the need to avoid arcing, thermal expansion and contraction limitations, and fabrication limitations.

The cross-section area of sinusoidal heating element 222 is given by the multiplying the cross-section width of sinusoidal heating element 222 generally at each radial position by the cross-section thickness of sinusoidal heating element 222 generally at each radial position. The cross-section area is held at a selected constant based on the size of the surface to be heated and the wattage requirement. Additional factors that determine the cross-section area of the sinusoidal heating element are the number of oscillations in the sinusoidal heating element, resistivity of the heating element, spacing between facing sides of the sinusoidal heating element, and the length of the sinusoidal heating element.

As indicated above, the cross-section thickness and the cross-section width of the heating element at each radial position are functions of the radial position on the sinusoidal heating element. The thickness can be represented in general by a function of the form $f_1(1/r)$ where r is radial position on the sinusoidal heating element and $f_1$ is the function. The term $1/r$ is used to indicate that the relation is an inverse relation. The width can be represented in general by a function of the form $f_2(r)$ where r is radial position on the sinusoidal heating element and $f_2$ is the function. Consequently, the cross-section area of the sinusoidal heating element is a function of the form $(f_1(1/r))(f_2(r))$.

For some embodiments of the present invention, the cross-section thickness of the sinusoidal heating element is derived from the equation:

$$t = 2\pi r_i^2 G t_i / (2\pi r^2 G - Sr) \quad (1)$$

where t is cross-section thickness of the heating element, r is radial position on the heating element, $\pi$ is the mathematical constant pi, $r_i$ is an inside radius of the heating element, $t_i$ is an initial trial thickness, G is a geometry factor equaling the angular width of the heating element spoke divided by the angular size of the heater, and S is the spacing between facing side surfaces of the heating element. More specifically, t and r are variables and $\pi$, $r_i$, $t_i$, G, and S are numerical parameters. With the knowledge of the numerical parameters for a heater, the thickness can be calculated as a function of radial position.

As will be recognized by persons of ordinary skill in the art, Equation 1 and the numerical parameters are the result of only one approach to obtaining a numerical representation of the dimensions of heaters according to one or more embodiments of the present invention. Other approaches will be recognized by persons of ordinary skill in the art in view of the disclosure in this specification. The derivation of Equation (1) was accomplished using $\pi$ the mathematical constant, $r_i$ as a designer choice, an outside radius of the heater as a designer choice, G as a designer choice, and S as a designer choice. The initial trial thickness of the heater element at the inside radius, $t_i$, is also a designer choice, but optionally $t_i$ may have to be refined by iteration so that the resistance of the heater element is more suitably matched for use with the full voltage and current capacity of the power source to be used with the heater. The capacity of the power source is also a designer choice. One possible iteration procedure is presented below in an example heater design.

It is also possible to derive the numerical parameters or equivalent constants for an equation similar to Equation (1) if heater thickness data as a function of radial position is known for a heater. A further simplified equation for such situations could be of the form:

$$t = A/(Br^2 - Sr) \quad (1.1)$$

where t, r, and S are the same as presented above and A and B are numerical values resulting from combining one or more of the numerical parameters presented above.

For some embodiments of the present invention, the cross-section width of the sinusoidal heating element is derived from the equation:

$$w = 2\pi Gr - S \quad (2)$$

where w is the cross-section width of the heating element, r is the radial position on the heating element, $\pi$ is the mathematical constant pi, G is a geometry factor equaling the angular width of the heating element spoke divided by the angular size of the heater, and S is a spacing between facing side surfaces of the heating element. The width of the heating element as a function of radial position can be calculated for more one or more embodiment of the present invention with designer specified values for angular width of the heating element spoke, the angular size of the heater, and the spacing.

A variety of materials may be used for sinusoidal heating element 222. According to one embodiment of the present invention, sinusoidal heating element 222 comprises a refractory electrical conductor. The sinusoidal heating element 222 may comprise graphite such as pyrolytic graphite. Further modifications can be made such as coating pyrolytic graphite with a material such as silicon carbide to produce sinusoidal heating element 222 having, as an example, a pyrolytic graphite conductor coated with silicon carbide. Examples of other materials that can be used for sinusoidal heating element 222 include, but are not limited to, nickel-chromium alloy, molybdenum, tantalum, tungsten, and other materials used for electrical resistance heating.

FIG. 4 shows electrical resistance heater 242 comprising two optional electrical contacts 238 positioned approximately at each end of sinusoidal heating element 222. It is to be understood that other means of making contact can be used for electrical heater 220. Electrical contact 238 may be a tab machined as part of sinusoidal heating element 222. As an option, electrical contact 238 is oriented substantially perpendicular to the surface of electrical resistance heater 220. Other orientations for electrical contact 238 can be used as will be clear to persons of ordinary skill in the art in view of the present disclosure. Electrical contacts 238 can be used to apply a DC or AC current through sinusoidal heating element 222.

FIG. 4 shows an optional configuration for peaks 228. Specifically, one or more of the peaks may be shorter than surrounding peaks as is shown for two of the peaks in FIG. 4. This optional configuration can be used to accommodate other structures such as attachment structures, sensors, holders that could be used for operating and monitoring electrical resistance heater 242. Similar modifications can be made to troughs 224.

Reference is now made to FIG. 4-1 where there is shown a perspective back view of an electrical resistance heater 242-1. Electrical resistance heater 242-1 is essentially the same as described for electrical resistance heater 242 described for FIG. 4 with the exception that electrical resistance heater 242-1 includes an optional electrical adapter 240 coupled with electrical contact 238 for each end of sinusoidal electrical conductor 222.

According to one embodiment of the present invention, electrical adapter 240 is formed so as to make a press-fit, also known in the art has an interference fit, coupling to electrical contact 238. For some embodiments of the present invention, serpentine heating element 222 may be made of pyrolytic graphite; as an option for those embodiments, electrical adapter 240 may be made of pyrolytic graphite. Optionally, electrical adapter 240 may be made of materials other than pyrolytic graphite that are also suitable for electrical connections.

Figure 5:
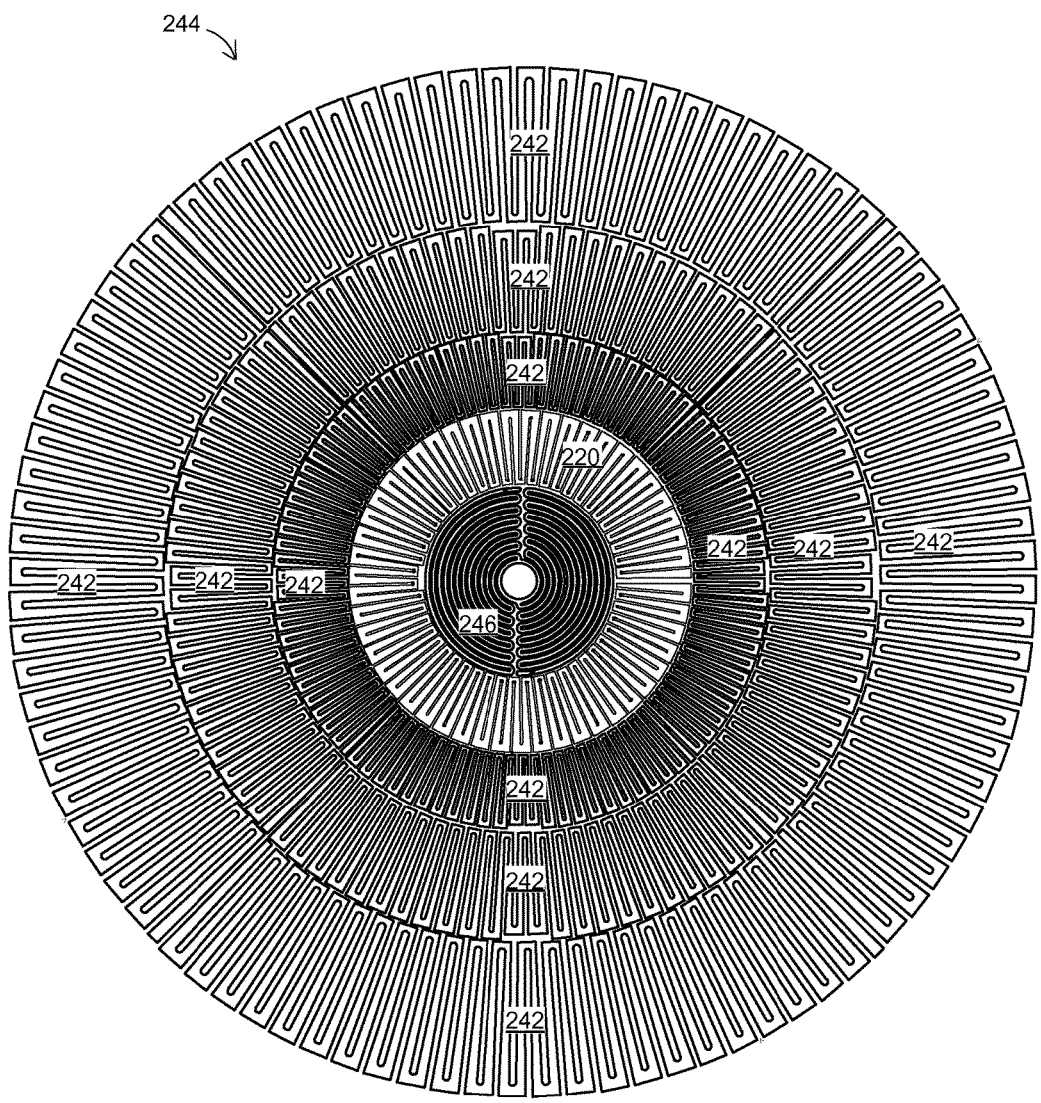
FIG. 5 is a front view of an apparatus for an embodiment of the present invention.
Figures 1, 5:
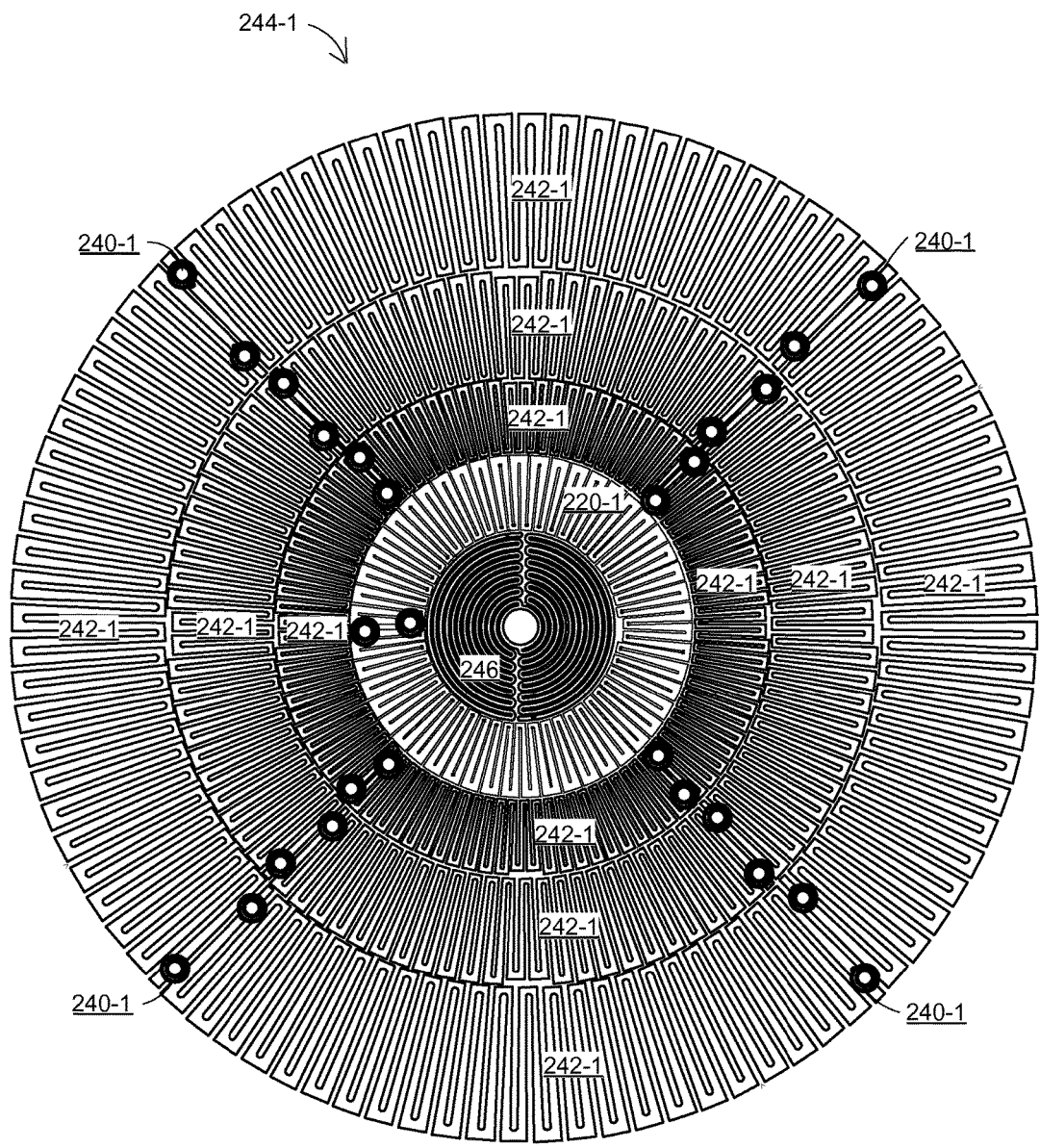

Reference is now made to FIG. 5 where there is shown a front view of a heater assembly 244 that may be used in system 100 or system 101 according to one embodiment of the present invention. Heater assembly 244 comprises a plurality of electrical resistance heaters shaped as rings or sections of rings. More specifically, heater assembly 244 comprises a first heater 246 located at the center. Optionally, first heater 246 may be a ring heater or a section of a ring heater. As another option, first heater 246 may be a ring heater that is essentially the same as electrical resistance heater 220 as described in FIG. 3 or a combination of electrical resistance heaters 242 as described in FIG. 4. Alternatively, first heater 246 may have a configuration other than the configuration for electrical resistance heaters 220 and electrical resistance heaters 242 described supra. The embodiment of the present invention shown in FIG. 5 has first heater 246 including a heating element having a dissimilar configuration to those of electrical resistance heater 220 and electrical resistance heater 242.

Heater assembly 244 further comprises an electrical resistance heater 220 surrounding first heater 246. Electrical resistance heater 220 is essentially the same as described for electrical resistance heater 220 in FIG. 3.

Heater assembly 244 further comprises 12 electrical resistance heaters 242 shaped as quarter ring sections and disposed so as to form a substantially planar array of concentric rings for a substantially circular heated area. Electrical resistance heater 242 is essentially the same as described for electrical resistance heaters 242 in FIG. 4. It is to be understood that other embodiments of the present invention may use a number of electrical resistance heaters 242 other than 12 and that the combination of ring heaters and sections of ring heaters may also differ from what is described for FIG. 5. Specifically, more than 12 electrical resistance heaters 242 may be used in embodiments of the present invention or fewer than 12 electrical resistance heaters 242 may be used in heating assemblies according to embodiments of the present invention. Similarly, more than one electrical resistance heater 220 may be used in heating assemblies according to embodiments of the present invention or no resistance heater 220 may be used in embodiments of the present invention.

Heater assemblies according to embodiments of the present invention include at least one electrical resistance heater selected from the group consisting of: electrical resistance heater 220, electrical resistance heater 220-1, electrical resistance heater 242, and electrical resistance heater 242-1.

Reference is now made to FIG. 5-1 where there is shown a back view of a heater assembly 244-1 according to one embodiment of the present invention. Heater assembly 244-1 comprises a plurality of electrical resistance heaters shaped as rings or sections of rings. More specifically, heater assembly 244-1 comprises a first heater 246-1 located at the center. First heater 246-1 comprises electrical contacts substantially as described above (electrical contacts not visible in FIG. 5-1) and electrical adapters such as electrical adapter 240-1 substantially as described above coupled to the electrical contacts. Optionally, first heater 246-1 may be a ring heater or a section of a ring heater. As another option, first heater 246-1 may be a ring heater that is essentially the same as electrical resistance heater 220-1 as described in FIG. 3-1 or a combination of electrical resistance heaters 242-1 as described in FIG. 4-1. Alternatively, first heater 246-1 may have a configuration other than the configuration for electrical resistance heaters 220-1 and electrical resistance heaters 242-1 described supra. The embodiment of the present invention shown in FIG. 5-1 has first heater 246-1 including a heating element having a dissimilar configuration to those of electrical resistance heaters 220-1 and electrical resistance heaters 242-2.

Heater assembly 244-1 further comprises an electrical resistance heater 220-1 surrounding first heater 246-1. Electrical resistance heater 220-1 is essentially the same as described for electrical resistance heaters 220-1 in FIG. 3-1. Electrical adapters 240-1 for electrical resistance heater 220-1 are also shown in FIG. 5-1.

Heater assembly 244-1 further comprises 12 electrical resistance heaters 242-1 shaped as quarter ring sections and disposed so as to form a substantially planar array of concentric rings for a substantially circular heated area. Electrical resistance heater 242-1 is essentially the same as described for electrical resistance heaters 242-1 in FIG. 4-1. Electrical adapters 240-1 for electrical resistance heater 242-1 are also shown in FIG. 5-1.

An apparatus according to another embodiment of the present invention is an electrical resistance heater that comprises a pyrolytic graphite heating element. The pyrolytic graphite heating element has one or more pyrolytic graphite electrical contacts. The electrical resistance heater further comprises one or more pyrolytic graphite electrical adapters such as electrical adapters 240 and electrical adapters 240-1 described above. The one or more electrical adapters are press-fit coupled to the one or more pyrolytic graphite electrical contacts. The electrical resistance heater further includes a layer of silicon carbide overcoating the heating element and electrical adapter. The silicon carbide overcoating is applied after press-fit coupling the one or more pyrolytic graphite electrical contacts to the one or more electrical adapters. The silicon carbide coating may be applied using a high temperature chemical vapor deposition process.

Figure 6:
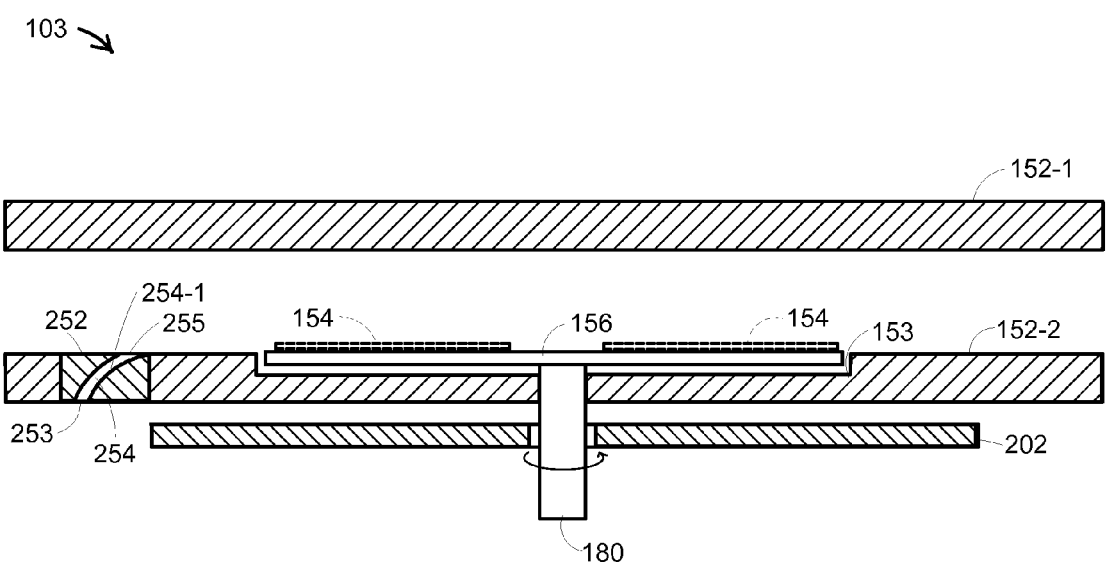
FIG. 6 is a cross-section side view of an embodiment of the present invention.

Reference is now made to FIG. 6 where there is shown a cross-section side view of a system 103 according to an embodiment of the present invention. System 103 comprises a process chamber having a top surface 152-1 and a bottom surface 152-2. Optionally, one or more substrates 154 (position of substrates shown as broken lines) may be placed on the bottom of the process chamber for processing. Alternatively, system 103 includes a substrate holder 156 disposed so as to hold one or more substrates 154 in the process chamber. As an option for some embodiments of the present invention, bottom surface 152-2 of the process chamber has a recessed area 153 that at least partially contains substrate holder 156. System 103 comprises a Rotary coupling 180 substantially as described above and a heater assembly 202 substantially as described above. System 103 is essentially the same as system 101, as described above, with the addition of at least one Coanda a gas injector 252.

More specifically, system 103 comprises at least one Coanda effect gas injector 252 disposed proximate a peripheral edge of substrate support 156 so as to provide a Coanda effect gas flow over the surface of substrate support 156 and/or the one or more substrates 154. According to some embodiments of the present invention, system 103 further comprises a gas flow control system (not shown in FIG. 3) in fluid communication with the at least one Coanda effect gas injector 252 so as to provide one or more reactive gases to the at least one Coanda effect gas injector 252.

In one embodiment of system 103, Coanda effect gas injector 252 has a gas entry port 253, a gas flow channel 254, and a gas exit port 255. Gas exit port 255 is in fluid communication with gas flow channel 254, and gas flow channel 254 is in fluid communication with the gas entry port 253. Gas flow channel 254 is formed by a convex surface 254-1 of Coanda effect gas injector 252 to produce the Coanda effect gas flow. More specifically, convex surface 254-1 is formed and disposed so as to tangentially approach a plane located approximately at the surface of a substrates 154 and/or the surface of substrate holder 156. Convex surface 254-1, according to one embodiment of the present invention, is a curved surface. As an option for other embodiments, convex surface 254-1 is formed by one or more sloping surfaces with little or no curvature for each of the sloping surfaces.

The Coanda effect gas flow results from flowing the gas over convex surface 254-1 which induces an attachment between the gas flow and convex surface 254-1 so that the gas flow substantially follows convex surface 254-1. The present inventors have found that the gas leaving Coanda effect gas injector 252 appears to continue the attachment for some distance to include at least part of the surface of substrate holder 156 and/or at least part of the surface of the one or more substrates 154. The present inventors believe that a possible explanation is that the attachment between the gas flow and the surfaces aid in keeping one or more reactive chemicals in the gas flow closer to the surface of the substrate so that the one or more reactive chemicals are more efficiently used for processing the surface of the substrates, or one or more other phenomena may be involved with producing the benefits from the use of the Coanda effect. In other words, the Coanda effect gas flow appears to interact synergistically with the surface of the substrate to keep the one or more reactive chemicals near the surface of the substrate for a longer time interval. Discussions of the Coanda effect can be found in "Applications of the Coanda Effect," by Imants Reba, Scientific American, Vol. 214, No. 6, June 1966, pages 84-92 and U.S. Pat. No. 2,052,869 to H. Coanda; the content of these documents are incorporated herein by this reference for all purposes.

As an option for some embodiments of the present invention, the at least one Coanda effect gas injector 252 has a gas exit port 255 that is rectangular in shape so as to form a slit. Alternatively, the gas exit port 255 may be square or another geometric shape.

As an option for some embodiments of the present invention, the at least one Coanda effect gas injector 252 is disposed in the process chamber so that gas exit port 255 is substantially coplanar with or above the surface of the one or more substrates 154 and/or substantially coplanar with or above the surface of substrate support 156. As another option, the at least one Coanda effect gas injector 252 is disposed in the process chamber so that gas exit port 255 is substantially coplanar with or above bottom surface 152-2 of the process chamber.

Figure 7:
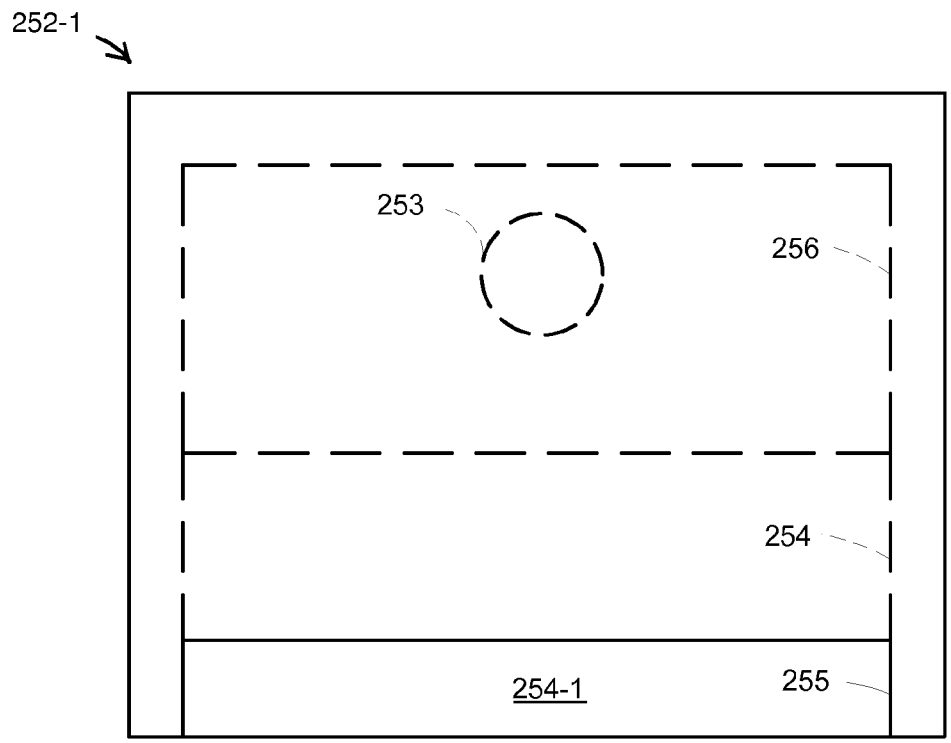
FIG. 7 is a top view of an apparatus for an embodiment of the present invention.
Figures 1, 7:
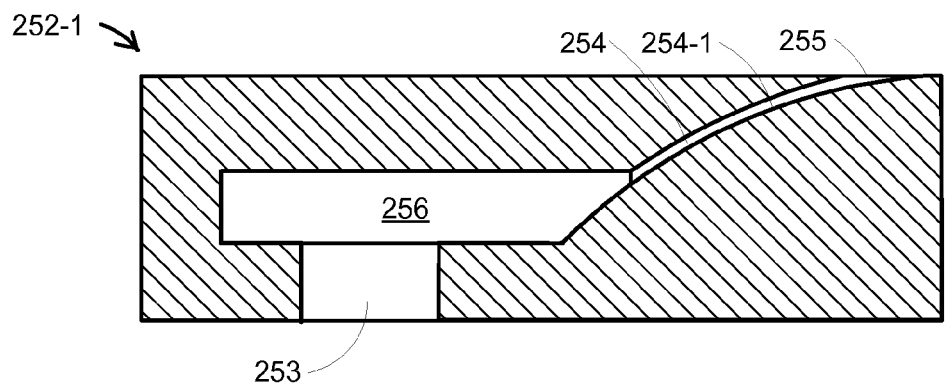

Reference is now made to FIG. 7 and FIG. 7-1 where there is shown a top view and a cross-section side view, respectively, of a Coanda effect gas injector 252-1 for one or more embodiments of the present invention. Broken lines are used to illustrate hidden lines. Coanda effect gas injector 252-1 may be used, as an option, to replace the at least one Coanda effect gas injector 252 described for embodiments of the present invention illustrated in FIG. 6. Coanda effect gas injector 252-1 is similar to the at least one Coanda effect gas injector 252.

Coanda effect gas injector 252-1 is a substantially rigid structure having a gas entry port 253, a gas flow channel 254, and a gas exit port 255. Coanda effect gas injector 252-1 also has a plenum 256 that is not present in the at least one Coanda effect gas injector 252. Gas exit port 255 is in fluid communication with plenum 256 via gas flow channel 254. Gas entry port 253 is in fluid communication with plenum 256. Gas flow channel 254 is formed by at least one convex surface 254-1 of Coanda effect gas injector 252-1 so as to produce the Coanda effect gas flow.

During operation, Coanda effect gas injector 252-1 receives a gas or a mixture of gases at gas entry port 253, the gas flows into plenum 256 from gas entry port 253 and continues on into gas flow channel 254, passes over convex surface 254-1, and exits at gas exit port 255.

Figure 8:
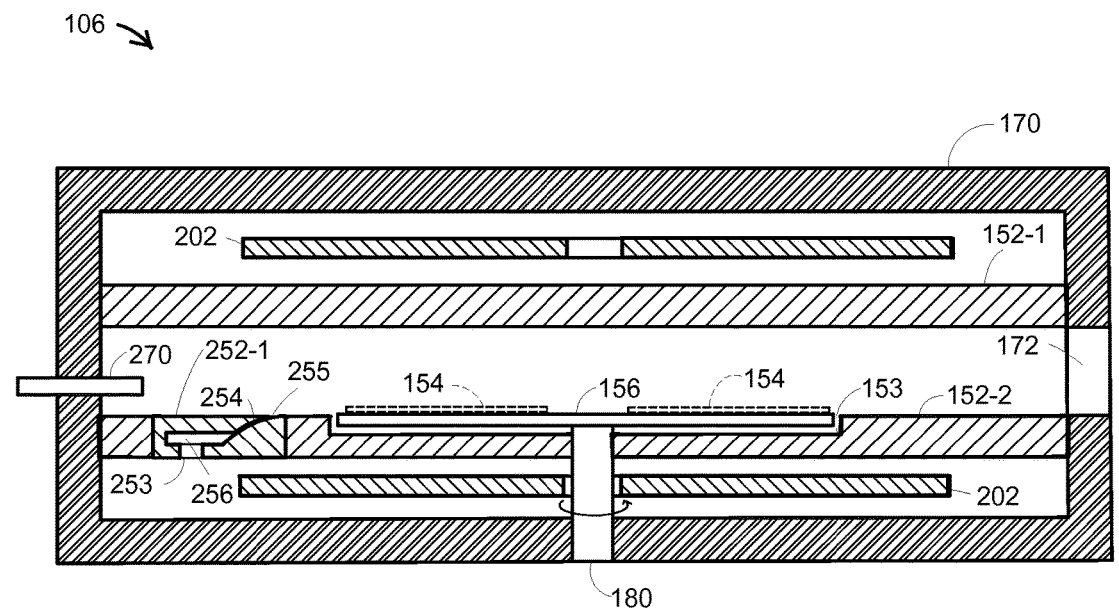
FIG. 8 is a cross-section side view of an embodiment of the present invention.
Figures 1, 8:
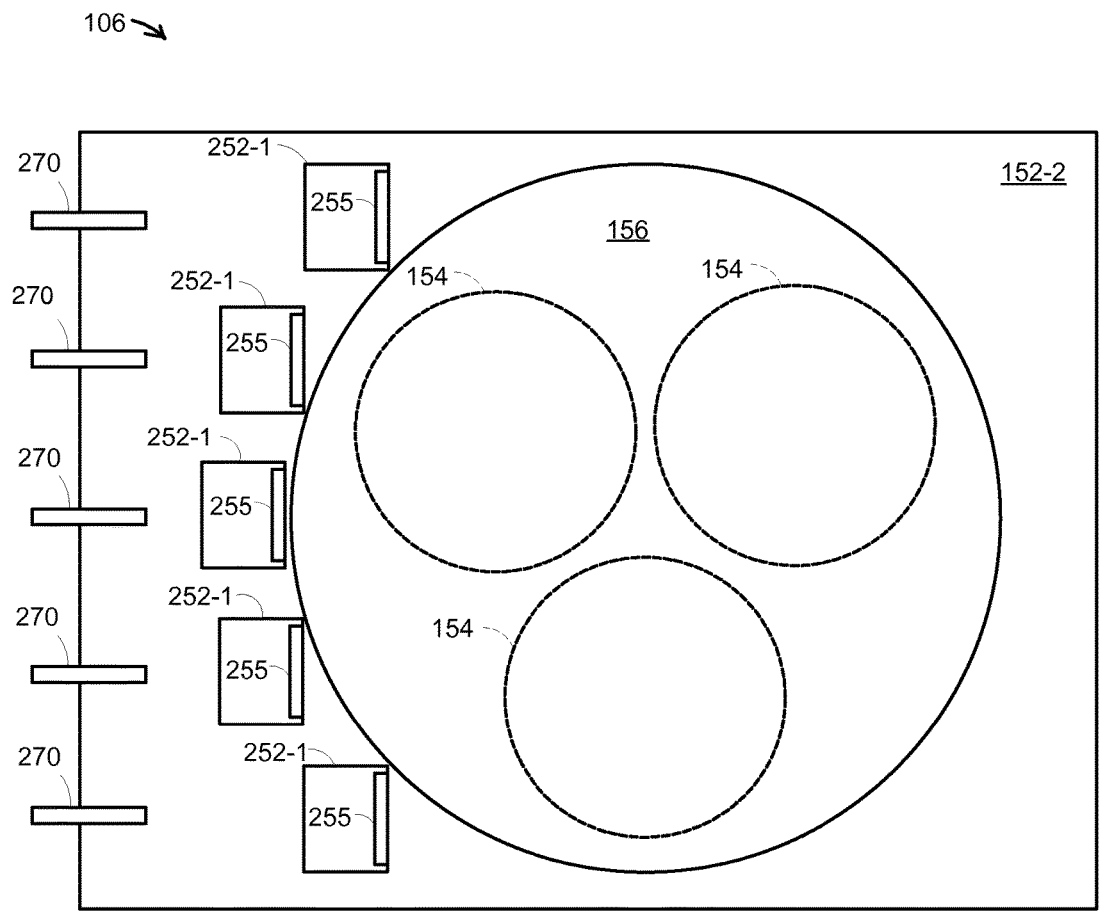

Reference is now made to FIG. 8 and FIG. 8-1 where there are shown a cross-section side view of a system 106 for processing substrates and a top view of the interior of system 106 according to an embodiment of the present invention. System 106 comprises a process chamber that includes a bottom surface 152-2 and a top surface (the top surface is not shown in FIG. 8-1). System 106 includes a substrate holder 156 disposed so as to hold one or more substrates 154 in the process chamber. FIG. 8 and FIG. 8-1, as an example, use broken lines to illustrate how three substrates 154 can be positioned for processing on substrate holder 156. As an option for some embodiments of the present invention, bottom surface 152-2 of the process chamber has a recessed area (not shown in FIG. 8-1) that at least partially contains substrate holder 156. System 106 comprises an outer chamber 170 having an exhaust port 172. Outer chamber 170 substantially encloses the process chamber.

System 106 comprises an optional rotary coupling connected with substrate support 156 for rotating the surface of substrate support 156 and the one or more substrates 154, if present thereon. Alternatively, system 106 may comprise a linear actuator connected with substrate support 156 for linear translation of the surface of substrate support 156.

System 106 comprises a heating system that includes a heater assembly 202 disposed so as to provide heat to substrates 154. System 106 has heater assembly 202 disposed so as to face the external side of bottom surface 152-2 so as to heat the substrates from the back surface. Optionally, heater assembly 202 may be disposed so as to face the external side of top surface 152-1 so as to heat the substrates from the front surface. As still another option as shown in FIG. 8, system 106 has a heater assembly 202 disposed over top surface 152-1 and a heater assembly 202 disposed below bottom surface 152-2 so that the substrates can be heated from the back surface and from the front surface. Heater assembly 202 includes one or more electrical resistance heaters substantially as described above.

More specifically, heater assembly 202 may comprise one or more electrical resistance heaters 220 as described above, one or more electrical resistance heaters 220-1 as described above, one or more electrical resistance heaters 242 as described above, one or more electrical resistance heaters 242-1 as described above, and/or one or more first heaters 246-1 as described above. Heater assembly 202 may be a heater assembly such as heater assembly 244 as described above or a heater assembly such as heater assembly 244-1 as described above.

System 106 comprises at least one Coanda effect gas injector 252-1 disposed proximate a peripheral edge of substrate support 156 so as to provide a Coanda effect gas flow over the surface of substrate support 156 and/or the one or more substrates 154. FIG. 8-1 shows five Coanda effect gas injectors 252-1. According to some embodiments of the present invention, system 106 further comprises a gas flow control system (not shown in FIG. 8 and FIG. 8-1) in fluid communication with the at least one Coanda effect gas injector 252-1 so as to provide one or more reactive gases to the at least one Coanda effect gas injector 252-1.

Coanda effect gas injector 252-1 is essentially the same as described above for FIG. 7 and FIG. 7-1. Alternatively, system 106 may comprise one or more or combinations of Coanda effect gas injectors such as Coanda effect gas injector 252 as described above for FIG. 6.

System 106 comprises at least one secondary gas injector 270 disposed so as to provide one or more gases or gas mixtures over bottom surface 152-2 of the process chamber. More specifically, the at least one secondary gas injector 270 is arranged to flow a gas or gas mixture over substrates 154 and/or substrate holder 156. FIG. 7 has five secondary gas injectors 270. The at least one secondary gas injector 270 is not a Coanda effect gas injector. The at least one secondary gas injector 270 may be a standard gas injector such as those typically used for processing substrates such as a solid body having a borehole for gas flow therethrough, such as a tube, such as a tube having a showerhead or nozzle, or such as another type of nozzle.

System 106 shows an embodiment with the at least one secondary gas injector 270 positioned behind the at least one Coanda effect gas injector 252-1. It is to be understood that other embodiments of the present invention may have relative positions and orientations of the at least one secondary gas injector 270 and the at least one Coanda effect gas injector 252-1 different from the arrangement shown in FIG. 8 and FIG. 8-1.

A potential benefit may be achieved for some embodiments of the present invention as a result of combining the use of the at least one Coanda effect gas injector 252-1 and the at least one secondary injector 270. In other words, a synergistic interaction between the gas flow from the at least one Coanda effect gas injector 252-1 and the gas flow from the at least one secondary injector 270 may yield improved process results.

As an option for some embodiments of the present invention, systems such as system 101, system 103, and system 106 may be configured to have hot wall process chambers for which the electrical resistance heaters are disposed so as to heat the substrates 154, the substrate holder 156, and the walls of the process chamber including top surface 152-1 and bottom surface 152-2. Alternatively, the system may be a cold wall system configured so that the electrical resistance heaters substantially only heat the substrates 154 and/or the substrate holder 156 without substantial heating of the walls of the process chamber and/or having cooled process chamber walls. A potential benefit for some embodiments of the present invention is that the Coanda effect gas flow could mitigate some of the effects of temperature-induced convection caused by variations in temperatures above the substrates.

For some embodiments of the present invention, the process chamber, the substrate support, the outer chamber, the heater assembly, and the Coanda effect gas injectors comprise materials suitable for processing semiconductor devices. Examples of materials suitable for use with embodiments of the present invention include, but are not limited to, aluminum oxide, aluminum nitride, silicon carbide, silicon nitride, silicon dioxide such as quartz or fused silica, stainless steel, graphite, and silicon carbide coated graphite.

Figure 9:
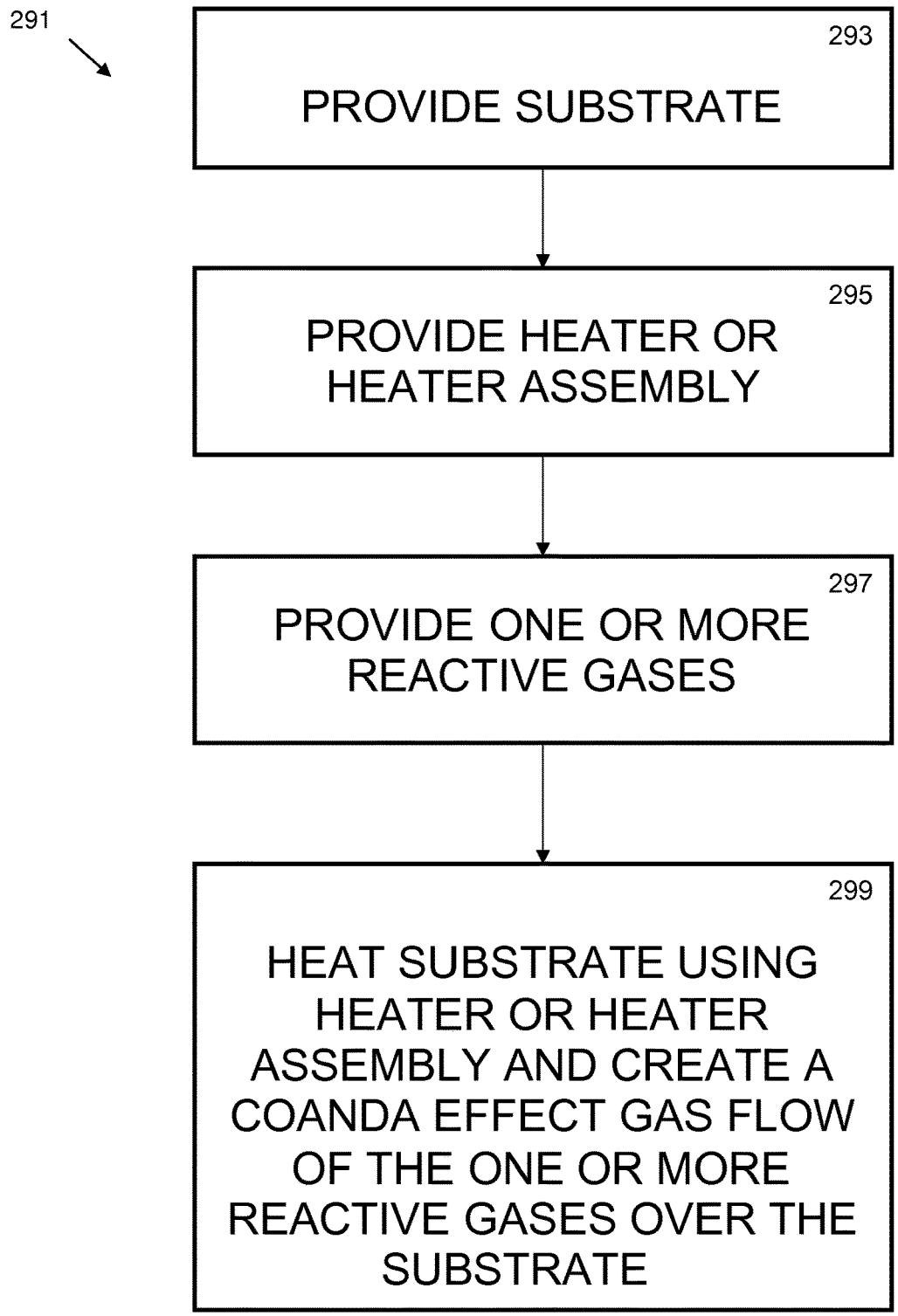
FIG. 9 is a process diagram of an embodiment of the present invention.

The systems and apparatuses described supra may be used for a wide variety of processes according to embodiments of the present invention. Reference is now made to FIG. 9 where there is shown an exemplary process diagram 291 according to one embodiment of the present invention. Exemplary process diagram 291 comprises a non-exhaustive series of steps to which additional steps (not shown) may also be added. One of ordinary skill in the art would recognize many variations, modifications, and alternatives. FIG. 9 shows exemplary process diagram 291 for performing a chemical reaction on a substrate comprises providing a substrate 293. Exemplary process diagram 291 comprises providing at least one heater or heater assembly 295 as described above and illustrated in FIG. 2, FIG. 3, FIG. 3-1, FIG. 4, FIG. 4-1, FIG. 5, and FIG. 5-1. Specific examples of heaters suitable for exemplary process diagram 291 are electrical resistance heater 220, electrical resistance heater 220-1, electrical resistance heater 242, electrical resistance heater 242-1, and first heater 246-1. Exemplary process diagram 291 comprises providing one or more reactive gases 297. Exemplary process diagram 291 further comprises applying heat to the substrate with the at least one heater or heating assembly and creating a Coanda effect gas flow of the one or more reactive gases over the substrate 299. The heat may be used to bring the substrate to a process temperature and/or to maintain the substrate at a process temperature for a process. Exemplary process diagram 291 may also comprise maintaining additional process conditions sufficient to cause the chemical reaction to occur.

As an option, exemplary process diagram 291 may also include one or more modifications for additional embodiments of the present invention. Exemplary modifications may include, but are not limited to, the following: Rotating the substrate during 299. Providing the substrate 293 comprises providing a semiconductor wafer. Providing the substrate 293 comprises providing a substrate for fabricating electronic or optoelectronic devices. Providing the substrate 293 comprises providing a silicon wafer. Providing the one or more reactive gases 297 comprises providing one or more precursors for semiconductor deposition. Providing the one or more reactive gases 297 comprises providing a silicon precursor. Providing the one or more reactive gases 297 comprises providing a compound selected from the group consisting of silane, dichlorosilane, trichlorosilane, and silicon tetrachloride. Providing the one or more reactive gases 297 comprises providing a dopant compound for a semiconductor. Providing the one or more reactive gases 297 comprises providing one or more precursors for deposition of Group IV element semiconductors, Group IV element compound semiconductors, Group III-V element semiconductors, or Group II-VI element semiconductors. Creating the Coanda effect gas flow of the one or more reactive gases over the substrate 299 while maintaining conditions sufficient to cause the chemical reaction to occur comprises conditions for deposition of epitaxial silicon. Creating the Coanda effect gas flow of the one or more reactive gases over the substrate 299 while maintaining conditions sufficient to cause the chemical reaction to occur comprises conditions for deposition of an epitaxial layer of materials such as, but not limited to, cadmium telluride, cadmium mercury telluride, gallium arsenide, gallium nitride, indium antimonide, indium phosphide, silicon, silicon germanium, and silicon carbide.

Clearly, embodiments of the present invention can be used for a wide variety of processes such as those for semiconductor device fabrication. Changes in the selected process gases and process conditions allow embodiments of the present invention to include substrate processes such as deposition processes for epitaxial layers, polycrystalline layers, nanocrystalline layers, or amorphous layers; processes such as substrate etching or cleaning; substrate oxidation; and/or substrate doping.

Embodiments of the present invention also include methods and apparatus for growing layers of materials such as elemental materials, compounds, compound semiconductors, and compound dielectric materials. In preferred embodiments for compound semiconductor applications, at least one of the Coanda effect gas injectors is connected so as to provide a flow of a gas comprising at least one of the elements boron, aluminum, gallium, indium, carbon, silicon, germanium, tin, lead, nitrogen, phosphorus, arsenic, antimony, sulfur, selenium, tellurium, mercury, cadmium, and zinc. Optionally, one or more Coanda effect gas injectors and/or one or more secondary gas injectors is connected so as to provide a flow of a gas or gas mixture such as hydrogen; an inert gas; hydrogen mixed with a dopant; or an inert gas mixed with a dopant.

Methods according to embodiments of the present invention may include the use of a variety of process gases such as those described above. The gases used for the method will depend on the process. In one embodiment, the gas flow streams comprise silicon source gas, dopant gas, and hydrogen.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Presented next is an exemplary procedure that may be used to design a heater according to one embodiment of the present invention. The heater for this design is similar in configuration to the ring heater shown in FIG. 1. Input data used for the heater include the following: inside radius: 2.75 inches; outside radius: 4.85 inches; spacing between facing side surfaces: 0.060 inch; heater material: molded graphite having a resistivity of about 0.00049 ohm inch; heater angular size: substantially 360°; number of spokes: 101; angular width of spoke+spacing: 3.545 degrees; segment length: 0.21 inch; and initial trial thickness: 0.135 inch. The input data for this example is used with Equation (1) and Equation (2) to calculate the heating element cross-section width and the heating element cross-section thickness at radial positions incrementally increasing by an amount equal to the segment length so as to provide calculations ranging from the inside radius to the outside radius of the heater. The calculations are shown in Table 1. For this example are in, the calculations are performed at 11 equally spaced radial positions along one of the spokes including the inside radius and the outside radius.

Additional related calculations are also shown in Table 1 such as cross-section area of the heating element as a function of radial position and the resistance for each of the segmented lengths. The resistance for the segment lengths are totaled to give the total resistance for the spoke and multiplied by the number of spokes to determine the total resistance for the heating element. These calculations also aid in showing a possible approach a designer can use to modify the design of the heater so that it more closely matches a desired or optimum utilization of the power source capability. Specifically, a designer can select a different initial trial thickness and repeat the calculations to obtain the total resistance for the heating element for comparison with the desired or optimum resistance for use with a power supply. This iteration process can be continued until the total resistance for the heating element is an optimum or desired match of resistance for use with the power source.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

While there have been described and illustrated specific embodiments of the invention, it will be clear that variations in the details of the embodiments specifically illustrated and described may be made without departing from the true spirit and scope of the invention as defined in the appended claims and their legal equivalents.

TABLE 1

| Input Data for Calculations | | | | | | |
|---|---|---|---|---|---|---|
| Inside Radius (in) | Outside Radius (in) | Segment Length (in) | Graphite Resistivity | Initial Trial Thickness (in) | Angular Width (degrees) | Number of Spokes |
| 2.75 | 4.85 | 0.21 | 0.00049 | 0.135 | 3.545 | 101 |

| Radial Position (in) | Circumference (in) | Width of Segment (in) | Trial Thickness (in) | Cross Section Area (sq. in) | Heater Element Cross-Section Width (in) | Heater Element Cross-Section Thickness (in) | Resistance of Segment (ohms) |
|---|---|---|---|---|---|---|---|
| 2.75 | 17.28 | 0.1701 | 0.135 | 0.02297 | 0.1101 | 0.2085 | 0.0045 |
| 2.96 | 18.60 | 0.1831 | 0.117 | 0.02134 | 0.1231 | 0.1733 | 0.0048 |
| 3.17 | 19.92 | 0.1961 | 0.102 | 0.01993 | 0.1361 | 0.1464 | 0.0052 |
| 3.38 | 21.24 | 0.2091 | 0.089 | 0.01869 | 0.1491 | 0.1253 | 0.0055 |
| 3.59 | 22.56 | 0.2221 | 0.079 | 0.01760 | 0.1621 | 0.1085 | 0.0058 |
| 3.80 | 23.88 | 0.2351 | 0.071 | 0.01662 | 0.1751 | 0.0949 | 0.0062 |
| 4.01 | 25.20 | 0.2481 | 0.063 | 0.01575 | 0.1881 | 0.0837 | 0.0065 |
| 4.22 | 26.52 | 0.2611 | 0.057 | 0.01497 | 0.2011 | 0.0744 | 0.0069 |
| 4.43 | 27.83 | 0.2741 | 0.052 | 0.01426 | 0.2141 | 0.0666 | 0.0072 |
| 4.64 | 29.15 | 0.2871 | 0.047 | 0.01361 | 0.2271 | 0.0599 | 0.0076 |
| 4.85 | 30.47 | 0.3001 | 0.043 | 0.01302 | 0.2401 | 0.0542 | 0.0079 |
| | | | | | | Spoke Resistance (ohms) | 0.0681 |
| | | | | | | Heater Resistance (ohms) | 6.8773 |

What is claimed is:

1. A system for processing one or more substrates, the system comprising:
   a process chamber;
   a substrate support disposed in the process chamber to hold one or more substrates; and
   at least one electrical resistance heater comprising a sinusoidal heating element having a plurality of peaks disposed to delineate an outer radius and a plurality of troughs disposed to delineate an inner radius; a cross-section width of the sinusoidal heating element being a first function of a radial position and a cross-section thickness of the sinusoidal heating element being a second function of the radial position so that the sinusoidal heating element provides a constant heat flux at the radial position and forms a constant spacing between facing side surfaces of the sinusoidal heating element, the at least one electrical resistance heater being disposed so as to heat the substrate support; wherein the radial position is a value that ranges from the inner radius to the outer radius.

2. The system of claim 1, further comprising:
   at least one Coanda effect gas injector disposed proximate a peripheral edge of the substrate support so as to provide a Coanda effect gas flow over a surface of the substrate support or the one or more substrates.

3. The system of claim 2, wherein the at least one Coanda effect gas injector has a gas exit port, a gas flow channel, and a gas entry port; the gas exit port is in fluid communication with the gas flow channel, the gas flow channel is in fluid communication with the gas entry port; the gas flow channel is formed by at least one convex surface of the Coanda effect gas injector to produce the Coanda effect gas flow.

4. The system of claim 2, wherein the at least one Coanda effect gas injector has a gas entry port, a plenum, a gas flow channel, and a gas exit port; the gas exit port is in fluid communication with the plenum via the gas flow channel, the gas entry port is in fluid communication with the plenum, the gas flow channel is formed by at least one convex surface of the Coanda effect gas injector so as to produce the Coanda effect gas flow.

5. The system of claim 2, further comprising a rotary coupling connected with the substrate support for rotating the surface of the substrate support.

6. The system of claim 2, further comprising a linear actuator connected with the substrate support for linear translation of the surface of the substrate support.

7. The system of claim 2, wherein the process chamber is a hot wall chamber for elevated temperature processes.

8. The system of claim 2, wherein the process chamber, the substrate support, and the at least one Coanda effect gas injector comprise materials selected from the group consisting of aluminum oxide, aluminum nitride, silicon carbide, silicon nitride, silicon dioxide, stainless steel, graphite, and silicon carbide coated graphite.

9. The system of claim 2, wherein the cross-section thickness of the sinusoidal heating element is a function of the form f(1/r) where r is the radial position.

10. The system of claim 2, wherein the cross-section width of the sinusoidal heating element is a function of the form f(r) where r is the radial position.

11. The system of claim 2, wherein the cross-section thickness of the sinusoidal heating element is:

$$t = 2\pi r_i^2 G t_i / (2\pi r^2 G - Sr)$$

where
   t is the cross-section thickness of the sinusoidal heating element,
   r is the radial position,
   π is the mathematical constant pi,
   $r_i$ is the inner radius of the sinusoidal heating element,
   $t_i$ is an initial trial thickness,
   G is a geometry factor equaling an angular width of the sinusoidal heating element between the peaks and troughs divided by an angular size of the at least one electrical resistance heater, and
   S is the constant spacing between facing side surfaces of the heating sinusoidal heating element.

12. The system of claim 2, wherein the cross-section width of the sinusoidal heating element is:

$$w=2\pi Gr-S$$

where
- w is the cross-section width of the sinusoidal heating element,
- r is the radial position,
- π is the mathematical constant pi,
- G is a geometry factor equaling an angular width of the sinusoidal heating element between the peaks and troughs divided by an angular size of the at least one electrical resistance heater, and
- S is the constant spacing between facing side surfaces of the sinusoidal heating element.

13. The system of claim 2, wherein the at least one electrical resistance heater comprises graphite coated with silicon carbide.

14. The system of claim 2, wherein the sinusoidal heating element comprises a material selected from the group consisting of nickel-chromium alloy, molybdenum, tantalum, and tungsten.

15. The system of claim 2, wherein the at least one electrical resistance heater further comprises electrical contacts and electrical adapters press-fit coupled thereto.

16. The system of claim 2, further comprising a secondary gas injector disposed so as to provide a gas flow to the process chamber.

17. A system for processing one or more substrates, the system comprising:
- an outer chamber;
- a process chamber disposed within the outer chamber;
- a substrate support disposed in the process chamber to hold one or more substrates;
- at least one electrical resistance heater comprising a sinusoidal heating element having a plurality of peaks disposed to delineate an outer radius and a plurality of troughs disposed to delineate an inner radius; a cross-section width of the sinusoidal heating element being a first function of a radial position and a cross-section thickness of the sinusoidal heating element being a second function of the radial position so that the sinusoidal heating element provides a constant heat flux at the radial position and forms a constant spacing between facing side surfaces of the sinusoidal heating element wherein the radial position is a value that ranges from the inner radius to the outer radius, the at least one electrical resistance heater comprising pyrolytic graphite electrical contacts and pyrolytic graphite electrical adapters press-fit coupled thereto and a thermally deposited silicon carbide overcoating, the at least one electrical resistance heater being disposed between the outer chamber and the process chamber so as to heat the substrate support;
- at least one Coanda effect gas injector disposed proximate a peripheral edge of the substrate support so as to provide a Coanda effect gas flow over the surface of the substrate support, the at least one Coanda effect gas injector having a gas entry port, a plenum, a gas flow channel, and a gas exit port; the gas exit port being in fluid communication with the plenum via the gas flow channel, the gas entry port being in fluid communication with the plenum, the gas flow channel being formed by at least one convex surface of the Coanda effect gas injector so as to produce a Coanda effect gas flow;
- at least one secondary gas injector disposed so as to provide a gas flow to the process chamber; and
- a rotary coupling connected with the substrate support for rotating the substrate support;

wherein the cross-section thickness of the sinusoidal heating element is:

$$t=2\pi r_i^2 Gt_i/(2\pi r^2 G - Sr)$$

where
- t is the cross-section thickness of the sinusoidal heating element,
- r is the radial position,
- π is the mathematical constant pi,
- $r_i$ is the inner radius of the sinusoidal heating element,
- $t_i$ is an initial trial thickness,
- G is a geometry factor equaling an angular width of the sinusoidal heating element between the peaks and troughs divided by an angular size of the at least one electrical resistance heater, and
- S is the constant spacing between facing side surfaces of the sinusoidal heating element;

wherein the cross-section width of the sinusoidal heating element is:

$$w=2\pi Gr-S$$

where
- w is the cross-section width of the sinusoidal heating element,
- r is the radial position,
- π is the mathematical constant pi,
- G is a geometry factor equaling an angular width of the sinusoidal heating element between the peaks and troughs divided by an angular size of the at least one electrical resistance heater, and
- S is the constant spacing between facing side surfaces of the sinusoidal heating element.

18. A system for processing one or more substrates, the system comprising:
- a process chamber;
- a substrate support disposed in the process chamber to hold one or more substrates;
- at least one electrical resistance heater comprising a sinusoidal heating element having a plurality of peaks disposed to delineate an outer radius and a plurality of troughs disposed to delineate an inner radius forming a plurality of spokes extending from the inner radius to the outer radius; a cross-section width of the sinusoidal heating element being a first function of a radial position and a cross-section thickness of the sinusoidal heating element being a second function of the radial position so that the sinusoidal heating element provides a constant heat flux at the radial position and forms a constant spacing between facing side surfaces of the sinusoidal heating element wherein the radial position is a value that ranges from the inner radius to the outer radius, the at least one electrical resistance heater being disposed so as to heat the substrate support;

wherein the cross-section thickness of the sinusoidal heating element is:

$$t=2\pi r_i^2 Gt_i/(2\pi r^2 G - Sr)$$

where
- t is the cross-section thickness of the sinusoidal heating element,
- r is the radial position,
- π is the mathematical constant pi,
- $r_i$ is the inner radius of the sinusoidal heating element,
- $t_i$ is an initial trial thickness, G is a geometry factor equaling an angular width of the sinusoidal heating element between the peaks and troughs divided by an angular size of the at least one electrical resistance heater, and S is the spacing between facing side surfaces of the sinusoidal heating element;

wherein the cross-section width of the sinusoidal heating element is:

$$w = 2\pi Gr - S$$

where w is the cross-section width of the sinusoidal heating element, r is the radial position, π is the mathematical constant pi, G is a geometry factor equaling an angular width of the sinusoidal heating element between the peaks and troughs divided by an angular size of the at least one electrical resistance heater, and S is the spacing between facing side surfaces of the sinusoidal heating element.

19. The system of claim 18, further comprising at least one Coanda effect gas injector disposed proximate a peripheral edge of the substrate support so as to provide a Coanda effect gas flow over the surface of the substrate support.

20. The system of claim 18, wherein the at least one electrical resistance heater comprises pyrolytic graphite electrical contacts and pyrolytic graphite electrical adapters press-fit coupled thereto and a thermally deposited silicon carbide overcoating.

21. The system of claim 18, further comprising:
at least one Coanda effect gas injector disposed proximate a peripheral edge of the substrate support so as to provide a Coanda effect gas flow over the surface of the substrate support;
at least one secondary gas injector disposed so as to provide a gas flow to the process chamber; and
a rotary coupling connected with the substrate support for rotating the substrate support.

22. The system of claim 18, further comprising an outer chamber containing the process chamber.

* * * * *